United States Patent [19]

Hsu

[11] Patent Number: 6,087,227
[45] Date of Patent: Jul. 11, 2000

[54] METHOD FOR FABRICATING AN ELECTROSTATIC DISCHARGE PROTECTION CIRCUIT

[75] Inventor: Chen-Chung Hsu, Hsinchu Hsien, Taiwan

[73] Assignee: United Microelectronics Corp., Hsinchu, Taiwan

[21] Appl. No.: 09/276,083

[22] Filed: Mar. 25, 1999

[51] Int. Cl.[7] .................. H01L 215/8234; H01L 21/336; H01L 21/4763

[52] U.S. Cl. .................... 438/275; 438/281; 438/302; 438/305; 438/592; 438/595

[58] Field of Search ................... 438/275, 281, 438/302, 305, 592, 595

[56] References Cited

U.S. PATENT DOCUMENTS

| | | |
|---|---|---|
| 3,661,747 | 5/1972 | Byrnes, Jr. et al. . |
| 4,203,800 | 5/1980 | Kitcher et al. . |
| 5,491,099 | 2/1996 | Hsu . |
| 5,946,573 | 8/1999 | Hsu . |
| 6,040,222 | 3/2000 | Hsu et al. . |

*Primary Examiner*—Richard Booth
*Assistant Examiner*—Ron Pompey
*Attorney, Agent, or Firm*—Hickman Stephens Coleman & Hughes, LLP

[57] ABSTRACT

A method for fabricating an electrostatic discharge (ESD) protection circuit on a substrate is provided. The substrate includes an internal circuit region and an ESD protection region. A first MOS transistor is formed at the internal circuit region including a first gate structure, a first spacer, a first source/drain region with a first lightly doped drain (LDD) structure. A second MOS transistor is formed at the ESD protection circuit region including a second gate structure, a second spacer, a second source/drain region with a second LDD structure. The method includes forming a conformal metal layer over the substrate. A patterned photoresist layer is formed on the metal layer to expose a portion of the metal layer. Under the exposed portion of the metal layer it includes the second spacer and a portion of the second source/drain region. Using the patterned photoresist layer as a mask, the exposed portion of the metal layer and the spacer is removed so as to expose a portion of the second source/drain region. The patterned photoresist layer is still used as a mask for an ion implantation process. The ion implantation process is performed to smear the second LDD structure so as to form a third source/drain region that replaces the second source/drain region. The photoresist layer is removed. A thermal process is performed on the remaining metal layer to accordingly form a Salicide layer.

20 Claims, 6 Drawing Sheets

METHOD FOR FABRICATING AN ELECTROSTATIC DISCHARGE PROTECTION CIRCUIT

BACKGROUND OF THE INVENTION

1. Field of the Invention

This invention relates to semiconductor fabrication, and more particularly to a method for fabricating an electrostatic discharge (ESD) protection circuit for a semiconductor device.

2. Description of Related Art

In the fabrication of an integrated circuit (IC) device, such as dynamic random access memory (DRAM) or statistic random access memory (SRAM), ESD is one of the main factors causing IC damage. For example, when one walks on a carpet with semiconductor wafers, if relative humidity (RH) is high, an electrostatic voltage of about a few hundred volts may exist on one's body and wafers. If the RH is very low, the electrostatic voltage may be even as high as about a few thousand volts. If a conductive object occasionally contacts the wafers, a strong ESD could occur and damage the ICs on the wafers. ESD is an especially serious problem for fabrication of a complementary metal-oxide semiconductor (CMOS) device.

In order to protect wafers from ESD damage, many methods to solve the ESD problem have been proposed. The most common conventional method is to make an ESD protection circuit between input/output (I/O) pads and internal circuits so that the ESD does not damage the ICs fabricated on the wafers. Currently, the ESD problem is one of main factors causing damage to the IC device at deep sub-micron level. It is very desired to have an ESD protection circuit, which can effectively protect IC devices from ESD damage.

Figure 1A:
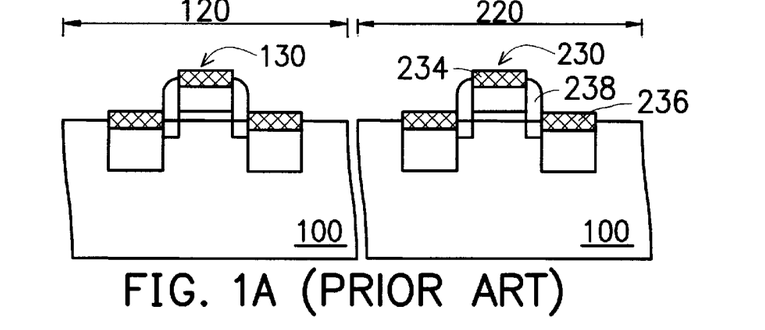
FIGS. 1A–1D are cross-sectional views of a portion of a substrate, schematically illustrating a conventional fabricating process to form an ESD protection circuit.

FIGS. 1A–1D are cross-sectional views of a portion of a substrate, schematically illustrating a conventional fabricating process to form an ESD protection circuit. In FIG. 1A, a semiconductor substrate 100 typically includes an internal circuit region 120 and an ESD circuit region 220. The internal circuit region 120 includes a normal circuit, such as a metal-oxide semiconductor (MOS) transistor 130 with a lightly doped drain (LDD) structure. Each gate structure also includes a spacer on each sidewall of the gate structures. The ESD protection circuit region 220 includes a protection circuit, which, for example, includes a MOS transistor 230 with a LDD structure. A self-aligned silicide (Salicide) layer is also formed on gate structures and source/drain regions of the MOS transistors 130 and 230. The source/drain region is formed in the substrate 100 at each side of the gate. For example for the MOS transistor 230, a Salicide layer 234 covers the gate structure, a Salicide layer 236 covers the source/drain region, and a spacer 238 is formed at each sidewall of the gate structure.

Figure 1B:
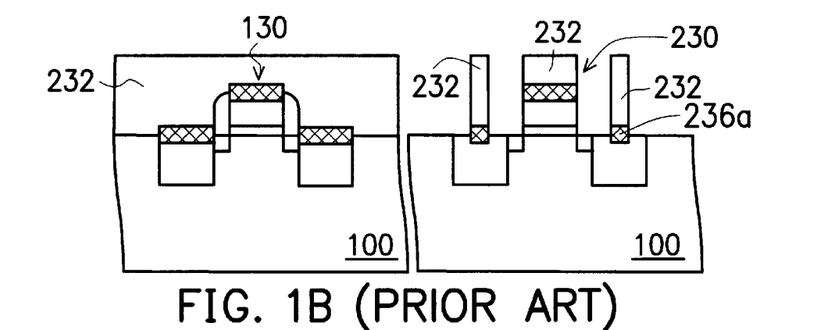

In FIG. 1B, a patterned photoresist layer 232 is formed over the substrate 100, in which the photoresist layer 232 covers the internal circuit region 120, the Salicide layer 230, and a portion of the Salicide layer 236 of the MOS transistor 230 at each side of the gate structure. So, a portion of the Salicide layer 236 on the source/drain region and the spacer 238 of the MOS transistor 230 are exposed. Using the photoresist layer 232 as a mask, the spacer 238 and the exposed portion of the Salicide layer 236 at the ESD protection circuit region 220 are removed by etching. A remaining portion of the Salicide layer 236 becomes a Salicide layer 236a. In this manner, during etching the Salicide layer 236 on the source/drain region, a substrate surface of the substrate 100 at the ESD protection circuit region 220 may be damaged, resulting in a poor performance of the ESD protection circuit.

Figure 1C:
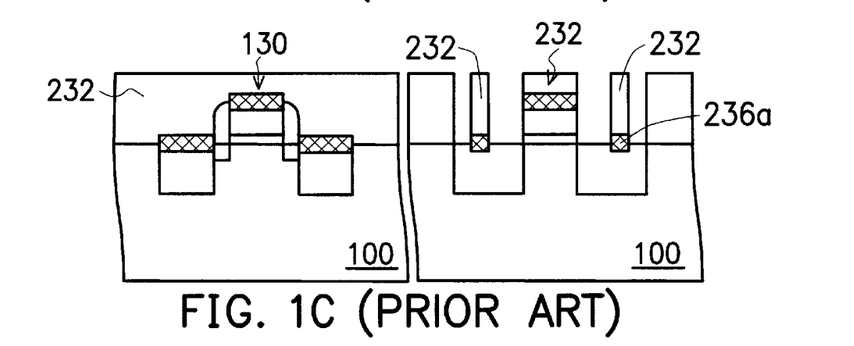

In FIG. 1C, an ion implantation process with a dopant type the same as a dopant type for the source/drain region is performed so as to merge the LDD structure, which is under the spacer 238 in FIG. 1A, with the source/drain region.

Figure 1D:
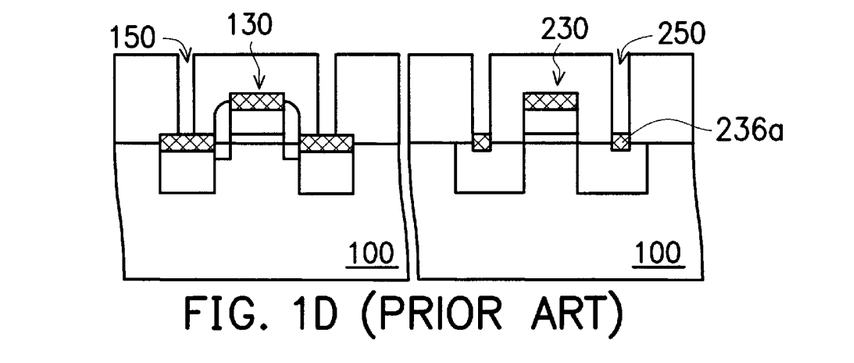

In FIG. 1D, the photoresist layer 232 of FIG. 1C is removed. A dielectric layer is formed over the substrate 100. A contact opening 150 is formed in the dielectric layer at the internal circuit region 120, and a contact opening 250 is formed in the dielectric layer at the ESD protection circuit region 220 so as to expose the Salicide layer 236a on the source/drain region of the MOS transistor 230. The rest part of the fabrication process to accomplished the ESD protection circuit is well known by the one skilled in the art and is not further described.

In the conventional method as described above, it includes two photoresist layers for patterning the Salicide layer and the ion implantation process. Fabrication cost is high. Moreover, when the Salicide layer on the source/drain region is patterned, the substrate surface at the ESD protection region may be damaged, resulting in a poor performance of the ESD protection circuit.

SUMMARY OF THE INVENTION

It is at least an objective of the present invention to provide an improved method for fabricating an electrostatic discharge (ESD) protection circuit on a substrate with a simplified fabrication process. A damage to a substrate surface on the source/drain region is also avoided so as to achieve a better performance of the ESD protection circuit.

In accordance with the foregoing and other objectives of the present invention, an improved method for fabricating an ESD protection circuit on a substrate is provided. The substrate includes an internal circuit region and an ESD protection circuit region. The ESD protection circuit is to be formed at the ESD protection circuit region. A first MOS transistor is formed at the internal circuit region, and a second MOS transistor is formed at the ESD protection circuit region. The first MOS transistor and the second MOS transistor preferably are formed simultaneously and are properly isolated by an isolation structure. The first MOS transistor includes a first gate structure, a first spacer on each sidewall of the first gate structure, a first source/drain region with a first lightly doped drain (LDD) structure located in the substrate at each side of the first gate structure. Similarly, the second MOS transistor includes a second gate structure, a second spacer on each sidewall of the second gate structure, a second source/drain region with a second LDD structure located in the substrate at each side of the second gate structure.

The improved method includes forming a conformal metal layer over the substrate. A patterned photoresist layer is formed on the conformal metal layer to expose a portion of the conformal metal layer. Under the exposed portion of the conformal metal layer it includes the second spacer, a portion of the second source/drain region, and the isolation structure to isolate the second MOS transistor. Using the patterned photoresist layer as a mask, the exposed portion of the conformal metal layer is removed by, for example, etching. The second spacer is continuously removed by, for example, etching. As a result, a portion of the second source/drain region is exposed. The patterned photoresist layer is still employed as a mask for an ion implantation process. The ion implantation process implants dopants with a dopant type as the same as a dopant type for the second source/drain region onto the exposed portion of the second source/drain region. The second LDD structure therefore is merged into the second source/drain region so that a third source/drain region is formed to replace the second source/drain region for the second MOS transistor. The patterned photoresist layer is removed so as to expose a remaining portion of the conformal metal layer. A thermal process is performed to trigger a reaction between the conformal metal layer and the substrate at a silicon-contained interface so that a Salicide layer is accordingly formed. A remaining portion of the conformal metal layer without reaction with silicon material is removed. Then, the second MOS transistor is formed to serve as a part of the ESD protection circuit.

In this improved method, only one photoresist layer is included so that the fabrication method is simplified. Fabrication cost is effectively reduced. Moreover, since the conformal metal layer is patterned before the Salicide layer is formed. A substrate surface on the second source/drain region is not damaged. In the conventional method, the Salicide layer is formed and then is patterned, in which since the Salicide layer is formed inside into the substrate surface, the substrate surface may be damaged as the Salicide layer is pattern.

In accordance with the foregoing and other objectives of the present invention, another improved method for fabricating an ESD protection circuit on a substrate is provided. The substrate includes an internal circuit region and an ESD protection circuit region. The ESD protection circuit is to be formed at the ESD protection circuit region. A first MOS transistor is formed at the internal circuit region, and a second MOS transistor is formed at the ESD protection circuit region. The first MOS transistor and the second MOS transistor preferably are formed simultaneously and are properly isolated by an isolation structure. The first MOS transistor includes a first gate structure, a first spacer on each sidewall of the first gate structure, and a first source/drain region with a first lightly doped drain (LDD) structure located in the substrate at each side of the first gate structure. Similarly, the second MOS transistor includes a second gate structure, a second spacer on each sidewall of the second gate structure, and a second source/drain region with a second LDD structure located in the substrate at each side of the second gate structure.

The another improved method includes forming a conformal metal layer over the substrate. A patterned photoresist layer is formed on the conformal metal layer to expose a portion of the conformal metal layer. Under the exposed portion of the conformal metal layer it includes the second spacer, a portion of the second source/drain region, and the isolation structure to isolate the second MOS transistor. Using the patterned photoresist layer as a mask, the exposed portion of the conformal metal layer is removed by, for example, etching. The patterned photoresist layer is removed. As a result the remaining conformal metal layer is exposed, and a portion of the second source/drain region other than the remaining conformal metal layer is also exposed. A rotational ion implantation process with slanted incident angles of its ion beam is performed so as to transform the second LDD structure, which is under the second spacer, into a heavily doped region like the second source/drain region. In the ion implantation process, the second gate structure with the second spacer is used as a part of the mask. Therefore, a third source/drain region is formed to replace the second source/drain region for the second MOS transistor. A thermal process is performed to trigger a reaction between the conformal metal layer and the substrate at a silicon-contained interface so that a Salicide layer is accordingly formed. A remaining portion of the conformal metal layer without reaction with silicon material is removed. Then, the second MOS transistor is formed to serve as a part of the ESD protection circuit.

In this improved method, only one photoresist layer is included so that the fabrication process is simplified. Due to the rotational ion implantation process with slanted incident angles, the spacer is not necessary to be removed. The fabrication process is further simplified. Fabrication cost is effectively reduced. Moreover, since the conformal metal layer is patterned before the Salicide layer is formed. A substrate surface on the second source/drain region is not damaged. In the conventional method, the Salicide layer is formed and then is patterned, in which since the Salicide layer is formed inside into the substrate surface, the substrate surface may be damaged as the Salicide layer is pattern.

BRIEF DESCRIPTION OF DRAWINGS

The invention can be more fully understood by reading the following detailed description of the preferred embodiment, with reference made to the accompanying drawings as follows.

DETAILED DESCRIPTION OF PREFERRED EMBODIMENT

The invention introduces a method for fabricating an ESD protection circuit with a less number of photoresist layers. A Salicide layer is patterned before a thermal process is performed so that a substrate surface of a source/drain region is not damaged. There are two preferred embodiments are disclosed as examples for descriptions.

EXAMPLE 1

Figure 2A:
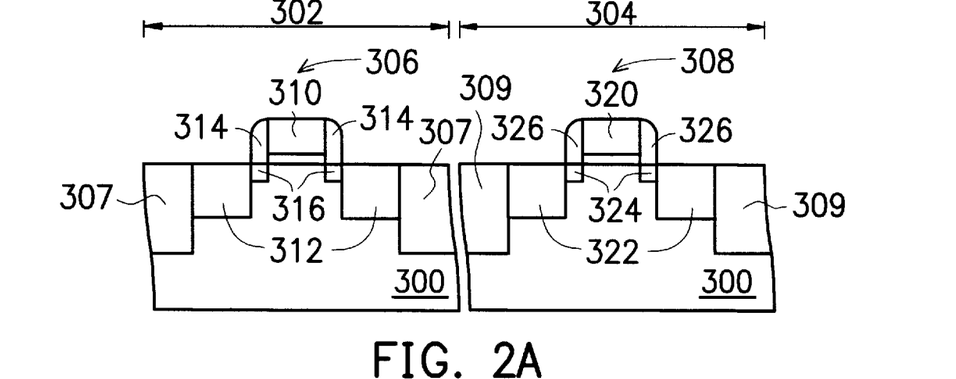
FIGS. 2A–2G are cross-sectional views of a portion of a substrate, schematically illustrating a fabricating process to form an ESD protection circuit, according to a first preferred embodiment of the invention.

FIGS. 2A–2G are cross-sectional views of a portion of a substrate, schematically illustrating a fabricating process to form an ESD protection circuit, according to a first preferred embodiment of the invention. In FIG. 2A, a substrate 300 includes an internal circuit region 302 and an ESD protection region 304. A MOS transistor 306 and a MOS transistor 308 are respectively formed at the internal circuit region 302 and the ESD protection circuit region 304. The MOS transistors 306 and 308 are preferably formed simultaneously and are respectively isolated by an isolation structure 307 and an isolation structure 309. The isolation structures 307, 309 includes, for example, a shallow trench isolation (STI) structure or a field oxide structure. The MOS transistor 306 includes a gate structure 310 with a gate oxide layer, a spacer 314 on each sidewall of the gate structure 310, a source/drain region 312 with a lightly doped drain (LDD) structure 316 below the spacer 314. Similarly, the MOS transistor 308 includes a gate structure 320 with a gate oxide layer, a spacer 326 on each sidewall of the gate structure 320, a source/drain region 322 with a lightly doped drain (LDD) structure 324 below the spacer 326.

Figure 2B:
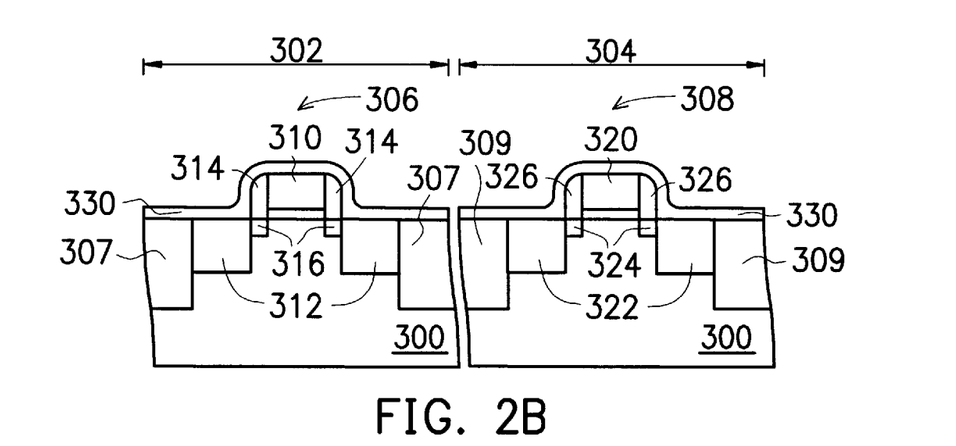

In FIG. 2B, a conformal metal layer 330 is formed over the substrate 300 by, for example, sputtering deposition. The metal layer 330 includes, for example, titanium or cobalt, which can endure a thermal process with a high temperature for a Salicide layer.

Figure 2C:
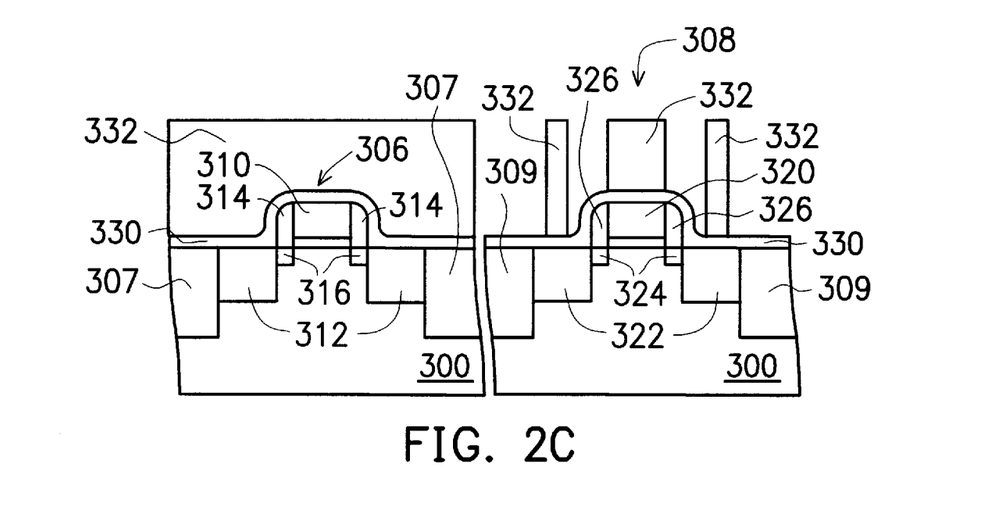

In FIG. 2C, a photoresist layer 332 is formed over the substrate 300 and is patterned by, for example, photolithography and etching so that a portion of the metal layer 330 at the ESD protection circuit region 304 is exposed. Below the exposed portion of the metal layer 330, it includes the isolation structure 309, the spacer 326, and a portion of the source/drain region 322.

Figure 2D:
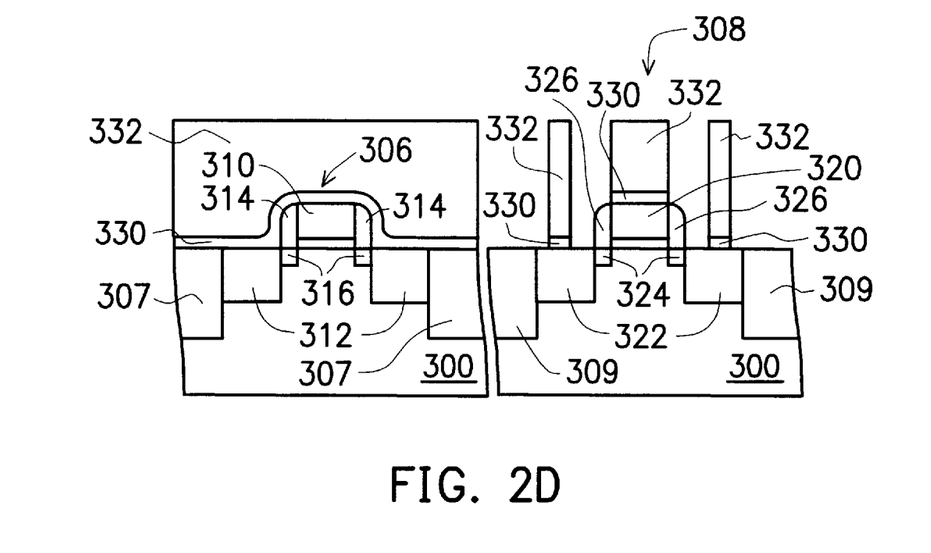

In FIG. 2D, using the photoresist layer 332 as a mask, the exposed portion of the metal layer 330 is removed by, for example, etching that preferably includes dry etching. After etching, the spacer 326, a portion of the source/drain region 322, and the isolation structure 309 are exposed.

Figure 2E:
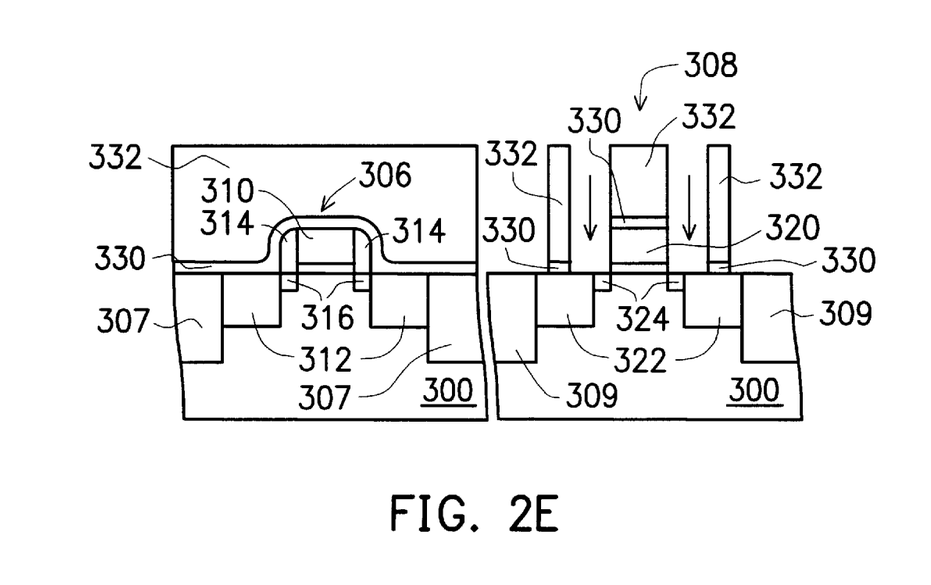

In FIG. 2E, still using the photoresist layer 332 as a mask, the spacer 326 (FIG. 332) is further removed by, for example, etching that preferably includes dry etching. The exposed portion of the metal layer 330 and the spacer 326 may also be removed in a single process of dry etching, in which a proper etching selectivity is selected. As the spacer 326 is removed, the LDD structure 324 is exposed. An ion implantation process is performed so as to smear away the LDD structure 324. The ion implantation includes heavily implanting dopants, which has a dopant-type the same as a dopant-type for the source/drain region 322.

Figure 2F:
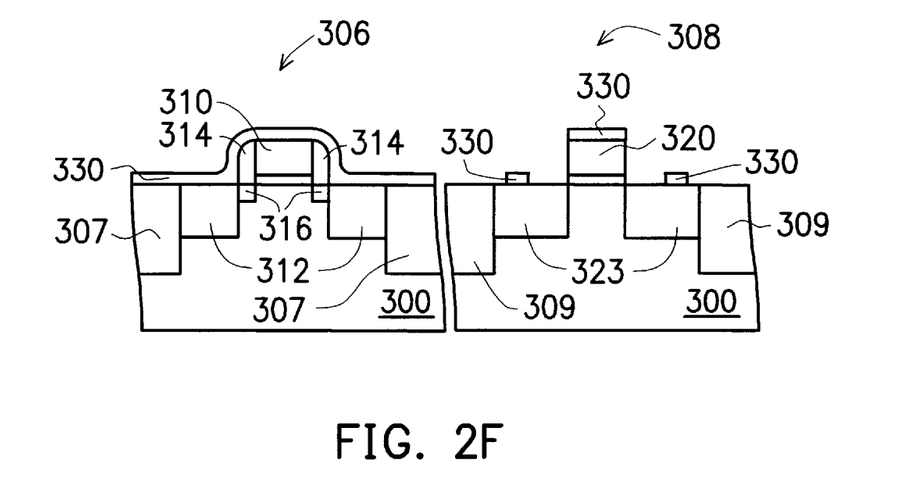

In FIG. 2F, after the ion implantation process, the source/drain region 322 and the LDD structure 324 in FIG. 2E are merged into a source/drain region 323. The photoresist layer 332 of FIG. 2E is removed by, for example, wet etching so as to expose the metal layer 330, which is originally covered by the photoresist layer 332. At this stage, the metal layer 330 covers the internal circuit region 302 in FIG. 2A, the gate structure 320, and a portion of the source/drain region 323.

Figure 2G:
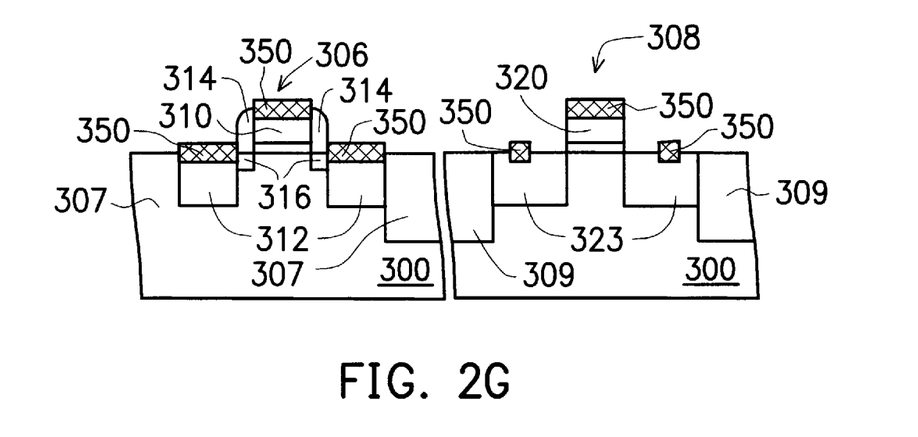

In FIG. 2G, a thermal process, such as a rapid thermal process (RTP), is performed to trigger a reaction between the metal layer 330 and substrate 300 at a portion including silicon material. After removing an unreaction portion of the metal layer 330 by, for example, dry etching, a Salicide layer 350 is formed on the gate structures 310, 320, the source/drain region 312, and a portion of the source/drain region 323. The MOS transistor 308 then is formed to serve as a part of the ESD protection circuit. Several fabrication processes to accomplish the ESD protection circuit, such as formation of interconnect, are well known by the one skilled in the art and are not further described here.

In this example of the invention, only the photoresist layer 332 is included so that the fabrication method is simplified. Fabrication cost is effectively reduced. Moreover, since the conformal metal layer 330 is patterned before the Salicide layer 350 is formed. A substrate surface on the second source/drain region 323 is not damaged. In the conventional method, the Salicide layer 236 in FIG. 1A is pre-formed and then is patterned to form the Salicide layer 236a in FIG. 1D, in which since the Salicide layer 236 is formed inside into the substrate surface of source/drain region, the substrate surface may be damaged as the Salicide layer is pattern.

EXAMPLE 2

The method introduced in the Example 1 can also be modified by using a rotational ion implantation process with slanted incident angles. The main characteristics of the invention still remain.

FIGS. 3A–3F are cross-sectional views of a portion of a substrate, schematically illustrating a fabricating process to form an ESD protection circuit, according to a second preferred embodiment of the invention. In the example 2, the first stage about the FIGS. 3A–3D is similar to that of the FIGS. 2A–2D.

Figure 3A:
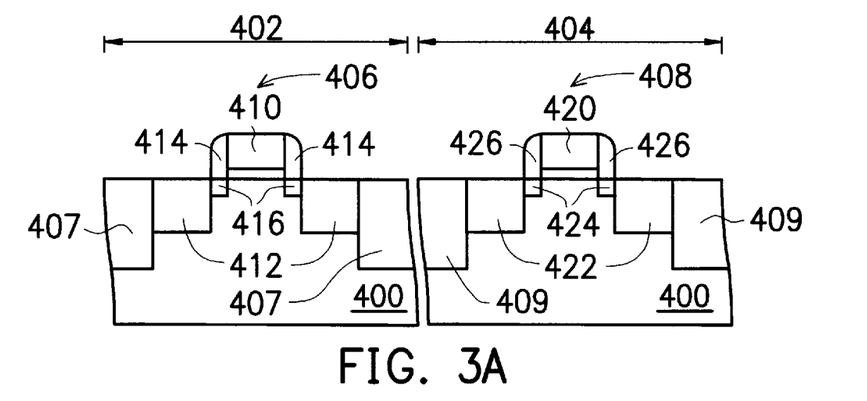
FIGS. 3A–3F are cross-sectional views of a portion of a substrate, schematically illustrating a fabricating process to form an ESD protection circuit, according to a second preferred embodiment of the invention.

In FIG. 3A a substrate 400 includes an internal circuit region 402 and an ESD protection region 404. A MOS transistor 406 and a MOS transistor 408 are respectively formed at the internal circuit region 402 and the ESD protection circuit region 404. The MOS transistors 306 and 308 are preferably formed simultaneously and are respectively isolated by an isolation structure 407 and an isolation structure 409. The isolation structures 407, 409 includes, for example, a shallow trench isolation (STI) structure or a field oxide structure. The MOS transistor 406 includes a gate structure 410 with a gate oxide layer, a spacer 414 on each sidewall of the gate structure 410, a source/drain region 412 with a lightly doped drain (LDD) structure 416 below the spacer 414. Similarly, the MOS transistor 408 includes a gate structure 420 with a gate oxide layer, a spacer 426 on each sidewall of the gate structure 420, a source/drain region 422 with a lightly doped drain (LDD) structure 424 below the spacer 426.

Figure 3B:
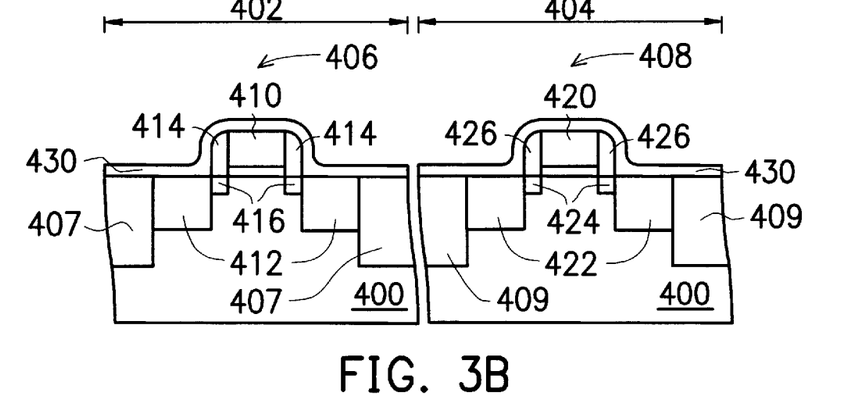

In FIG. 3B, a conformal metal layer 430 is formed over the substrate 400 by, for example, sputtering deposition. The metal layer 430 includes, for example, titanium or cobalt, which can endure a thermal process with a high temperature for a Salicide layer.

Figure 3C:
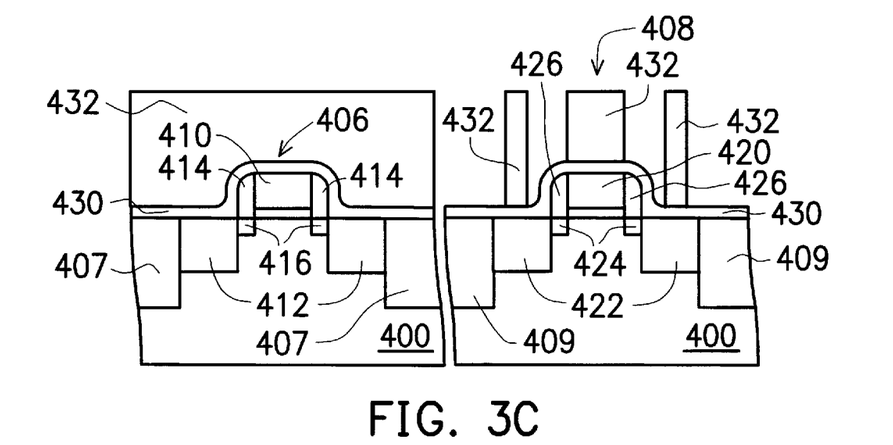

In FIG. 3C, a photoresist layer 432 is formed over the substrate 400 and is patterned by, for example, photolithography and etching so that a portion of the metal layer 430 at the ESD protection circuit region 404 is exposed. Below the exposed portion of the metal layer 430, it includes the isolation structure 409, the spacer 426, and a portion of the source/drain region 422.

Figure 3D:
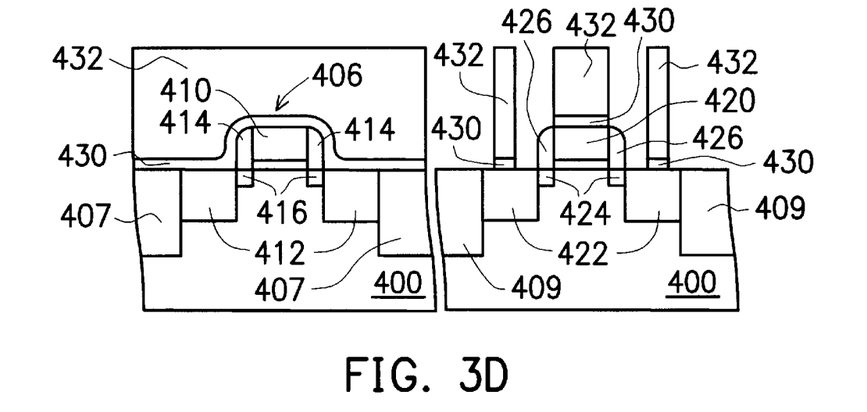

In FIG. 3D, using the photoresist layer 432 as a mask, the exposed portion of the metal layer 430 is removed by, for example, etching that preferably includes dry etching. After etching, the spacer 426, a portion of the source/drain region 422, and the isolation structure 409 are exposed.

Figure 3E:
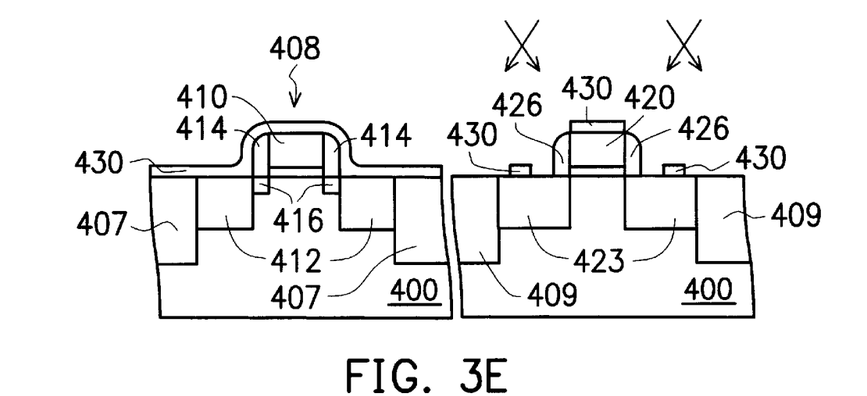

In FIG. 3E, the photoresist layer 432 in FIG. 3D is removed by, for example, etching, which preferably includes wet etching. A rotational ion implantation process is performed to smear the LDD structure 424, using the conformal metal layer 430, the gate structures 410, 420, and the spacer 426 as a mask. The rotational ion implantation process includes slanted angles as shown in FIG. 3E by arrow directions. The slanted angles includes an angle range about between 15° and 60° from a normal incident direction to the substrate 400. For example, in the cross sectional plane of the FIG. 3E, the slanted angles includes, for example, two incident angles with opposite deviation from the normal incident direction as shown by the arrows in FIG. 3E. Here, the purpose of the two incident angles is to merge the LDD structure 424 at each side of the gate structure 420, in which one incident angle is for one side. A dopant type used by the rotational ion implantation process is the same as that used for the source/drain region 422. As a result, a source/drain region 423 is formed to replace the source/drain region 422 with the LDD structure 424 in FIG. 3D. Due to the property of the rotational ion implantation process, the spacer 426 is not necessary to be removed by an extra process.

Figure 3F:
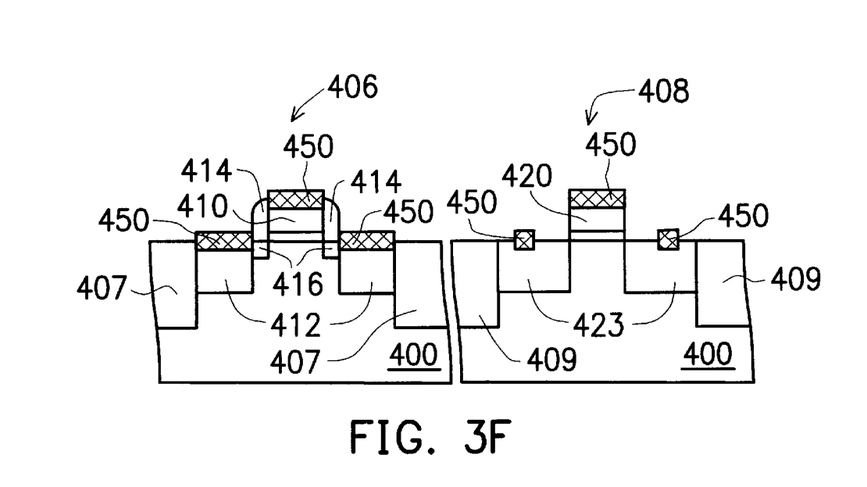

In FIG. 3F, a thermal process, such as a rapid thermal process (RTP), is performed to trigger a reaction between the metal layer 430 and substrate 400 at a portion including silicon material. After removing an unreaction portion of the metal layer 430 by, for example, dry etching, a Salicide layer 450 is formed on the gate structures 410, 420, the source/drain region 412, and a portion of the source/drain region 423. The MOS transistor 408 then is formed to serve as a part of the ESD protection circuit. Several fabrication processes to accomplish the ESD protection circuit, such as formation of interconnect, are well known by the one skilled in the art and are not further described here.

In this example, only one photoresist layer 432 is included so that the fabrication process is simplified. Due to the rotational ion implantation process with slanted incident angles, the spacer 426 is not necessary to be removed. The fabrication process is further simplified. Fabrication cost is effectively reduced. Moreover, since the conformal metal layer is patterned before the Salicide layer is formed. A substrate surface on the second source/drain region is not damaged. In the conventional method, the Salicide layer is formed and then is patterned, in which since the Salicide layer is formed inside into the substrate surface, the substrate surface may be damaged as the Salicide layer is pattern.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A method for fabricating an electrostatic discharge (ESD) protection circuit on a substrate, which includes an internal circuit region and an ESD protection circuit region, in which a first MOS transistor is formed at the internal circuit region, and a second MOS transistor is formed at the ESD protection circuit region, wherein the first MOS transistor isolated by a first isolation structure includes a first gate structure, a first spacer on each sidewall of the first gate structure, and a first source/drain region with a first lightly doped drain (LDD) structure located in the substrate at each side of the first gate structure, and the second MOS transistor isolated by a second isolation structure includes a second gate structure, a second spacer on each sidewall of the second gate structure, and a second source/drain region with a second LDD structure located in the substrate at each side of the second gate structure, the method comprising:

forming a metal layer over the substrate, wherein the metal layer is conformal to the substrate;

forming a patterned photoresist layer on the metal layer;

patterning the photoresist layer to expose a portion of the metal layer, wherein under the exposed portion of the metal layer it comprises the second spacer, a portion of the second source/drain region, and the second isolation structure;

removing the exposed portion of the metal layer, using the photoresist layer as a mask;

continuously removing the second spacer so as to expose the second source/drain region and the second LDD structure;

performing an ion implantation process, still using the photoresist layer as a mask, so as to merge the second LDD structure with the second source/drain region into a third source/drain region for the second MOS transistor;

removing photoresist layer so as to expose the remaining metal layer; and forming a self-aligned silicide (Salicide) layer on the first source/drain region, the first gate structure, the second gate structure, and a portion of the third source/drain region through using the metal layer.

2. The method of claim 1, wherein the step of forming the Salicide layer further comprises:

performing a thermal process to trigger a reaction on an interface region between the metal layer and the substrate at a portion comprising silicon material; and removing an unreaction portion of the metal layer.

3. The method of claim 2, wherein the thermal process comprises a rapid thermal process (RTP).

4. The method of claim 2, wherein the unreaction portion of the metal layer is removed by dry etching.

5. The method of claim 1, wherein the step of forming the metal layer comprises a sputtering deposition.

6. The method of claim 1, wherein the metal layer comprises a metallic material, which can endure a subsequent thermal process at its operation temperature.

7. The method of claim 1, wherein the metal layer comprises titanium or cobalt.

8. The method of claim 1, wherein the step of patterning the photoresist layer comprises photolithography and etching.

9. The method of claim 1, wherein the step of continuously removing the second spacer comprises dry etching.

10. The method of claim 1, wherein in the step of performing the ion implantation process, the ion implantation process comprises implanting dopants with a dopant type the same as a dopant type for the second source/drain region.

11. A method for fabricating an electrostatic discharge (ESD) protection circuit on a substrate, which includes an internal circuit region and an ESD protection circuit region, in which a first MOS transistor is formed at the internal circuit region, and a second MOS transistor is formed at the ESD protection circuit region, wherein the first MOS transistor isolated by a first isolation structure includes a first gate structure, a first spacer on each sidewall of the first gate structure, and a first source/drain region with a first lightly doped drain (LDD) structure located in the substrate at each side of the first gate structure, and the second MOS transistor isolated by a second isolation structure includes a second gate structure, a second spacer on each sidewall of the second gate structure, and a second source/drain region with a second LDD structure located in the substrate at each side of the second gate structure, the method comprising:

forming a metal layer over the substrate, wherein the metal layer is conformal to the substrate;

forming a patterned photoresist layer on the metal layer;

patterning the photoresist layer to expose a portion of the metal layer, wherein under the exposed portion of the metal layer it comprises the second spacer, a portion of the second source/drain region, and the second isolation structure;

removing the exposed portion of the metal layer, using the photoresist layer as a mask;

removing the photoresist layer;

performing a rotational ion implantation process so to merge the second LDD structure with the second source/drain region into a third source/drain region for the second MOS transistor;

performing a thermal process to form a self-aligned silicide (Salicide) layer on the first source/drain region, the first gate structure, the second gate structure, and a portion of the third source/drain region through a reaction between the metal layer and silicon material thereon; and removing an unreaction portion of the metal layer.

12. The method of claim 11, wherein the step of performing the thermal process to form the Salicide layer comprises a rapid thermal process (RTP).

13. The method of claim 11, wherein the step of forming the metal layer comprises a sputtering deposition.

14. The method of claim 11, wherein the metal layer comprises a metallic material, which can endure a subsequent thermal process at its operation temperature.

15. The method of claim 11, wherein the metal layer comprises titanium or cobalt.

16. The method of claim 11, wherein the step of patterning the photoresist layer comprises photolithography and etching.

17. The method of claim 11, wherein in the step of performing the rotational ion implantation process, the rotational ion implantation process comprises implanting dopants with a dopant type the same as a dopant type for the second source/drain region.

18. The method of claim 11, wherein in the step of performing the rotational ion implantation process, the rotational ion implantation process comprises a plurality of different incident angles, which is reference to a normal incident direction to the substrate.

19. The method of claim 18, wherein the incident angles comprises a range of about 15°–60°.

20. The method of claim 19, wherein the incident angles comprises two incident angles, which are deviated from the normal incident direction in an opposite direction so as to merge the second LDD structure at each side of the second gate structure.

* * * * *